United States Patent
Oh et al.

(10) Patent No.: US 7,375,389 B2
(45) Date of Patent: May 20, 2008

(54) SEMICONDUCTOR DEVICE HAVING A CAPACITOR-UNDER-BITLINE STRUCTURE AND METHOD OF MANUFACTURING THE SAME

(75) Inventors: Jae-Hee Oh, Sungnam-si (KR); Duck-Hyung Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/780,606

(22) Filed: Feb. 19, 2004

(65) Prior Publication Data
US 2004/0173836 A1    Sep. 9, 2004

(30) Foreign Application Priority Data
Mar. 7, 2003    (KR) ............... 10-2003-0014414

(51) Int. Cl.
*H01L 27/108* (2006.01)
(52) U.S. Cl. ............... 257/296; 257/306; 257/758
(58) Field of Classification Search ............ 257/296, 257/306, 755, 758
See application file for complete search history.

(56) References Cited

U.S. PATENT DOCUMENTS 5,389,558 A * 2/1995 Suwanai et al. ........... 438/241
6,163,046 A * 12/2000 Okumura et al. ......... 257/306
6,503,794 B1 * 1/2003 Watanabe et al. ......... 438/253

FOREIGN PATENT DOCUMENTS

JP    2000-349247    12/2000
KR    1020030009207    1/2003

OTHER PUBLICATIONS

Korean Office Action dated Apr. 28, 2005.

* cited by examiner

*Primary Examiner*—Ori Nadav
(74) *Attorney, Agent, or Firm*—Harness, Dickey & Pierce, P.L.C.

(57) ABSTRACT

Provided are semiconductor devices having a system-on-chip (SOC) configuration that combines both a capacitor-based cell-array memory region and one or more MOS core/peripheral circuit/logic regions on a single chip and a method for manufacturing such devices. The manufacturing process reduces the number of additional photolithographic processes required and modifies the relationship between the sizing of various layers and/or structures to reduce the fabrication cost and improve the reliability of the resulting devices. In particular, the capacitors for the memory region are formed in the same insulating layer as the first metal pattern for the core/peripheral circuit/logic regions of the devices, thereby producing capacitors and metal patterns of substantially the same height and thickness respectively. A landing structure may also be formed in the cell array region in combination with the first metal pattern for improving the contact process in the cell array region.

10 Claims, 12 Drawing Sheets

SEMICONDUCTOR DEVICE HAVING A CAPACITOR-UNDER-BITLINE STRUCTURE AND METHOD OF MANUFACTURING THE SAME

CROSS REFERENCE TO RELATED APPLICATIONS

This application claims priority under 35 USC § 119 to Korean Patent Application No. 2003-14414, filed on Mar. 7, 2003, the contents of which are herein incorporated by reference in their entirety for all purposes.

BACKGROUND OF THE INVENTION

1. Field of the Invention

The present invention relates to a semiconductor device and a method of manufacturing the same and, more particularly, to an embedded dynamic random access memory (EDRAM) having a capacitor-under-bitline (CUB) structure and a method of manufacturing such an EDRAM.

2. Description of the Related Art

As semiconductor devices have become more highly integrated, a system on a chip (SOC) technology has become more widely employed in semiconductor fabricating processes. The SOC technology provides value added features to the semiconductor device by integrating elements having various functions in single chip, thus reducing the number of chips required and the assembly complexity and potentially improving the speed and reliability of the desired functionality.

The SOC version of an embedded memory logic (EML) device, for instance, will typically include at least a memory device and a logic device integrated on single chip. Such an EML device may be divided into a cell array region and a logic circuit region. Memory cells disposed on the cell array region may then be used to store information processed by the logic circuit or provide information to the logic circuit from which new information may be generated. A DRAM cell or a SRAM cell may be used as the memory cell of the EML device.

The EDRAM fabricating process includes a reciprocal logic structure and a high-integrated DRAM structure. When a stack type capacitor structure is employed in the EDRAM device, the capacitor may be configured as either a CUB structure that is formed prior to forming a bit line or a capacitor-over-bitline (COB) structure that a capacitor is formed in conjunction with the form a bit line.

An advantage of the COB structure is that the capacitor may be formed without significant regard for the processing margin associated with the subsequent formation of the bit line during fabrication of the highly integrated semiconductor device. A disadvantage of the COB structure is that the cost of semiconductor fabrication is increased by the additional photolithographic processes, typically eight to ten, that may be required to add a COB structure to a standard logic device fabrication process. On the other hand, the use of a CUB structure tends to limit the degree to which the integration of the semiconductor device may be increased. However, the additional cost associated with including a CUB structure in a standard logic device fabrication process is reduced relative to a COB structure because only three to five additional photolithography processes are typically required.

As a result, CUB structures have been more widely utilized in the production of EDRAM devices. Because the electrical characteristics of a MOS transistor may be significantly influenced by the thermal budget associated with subsequent processing during device fabrication, cell capacitors utilizing a metal/insulator/metal (MIM) structure may be included in EDRAM devices to reduce the thermal budget.

Figure 1:
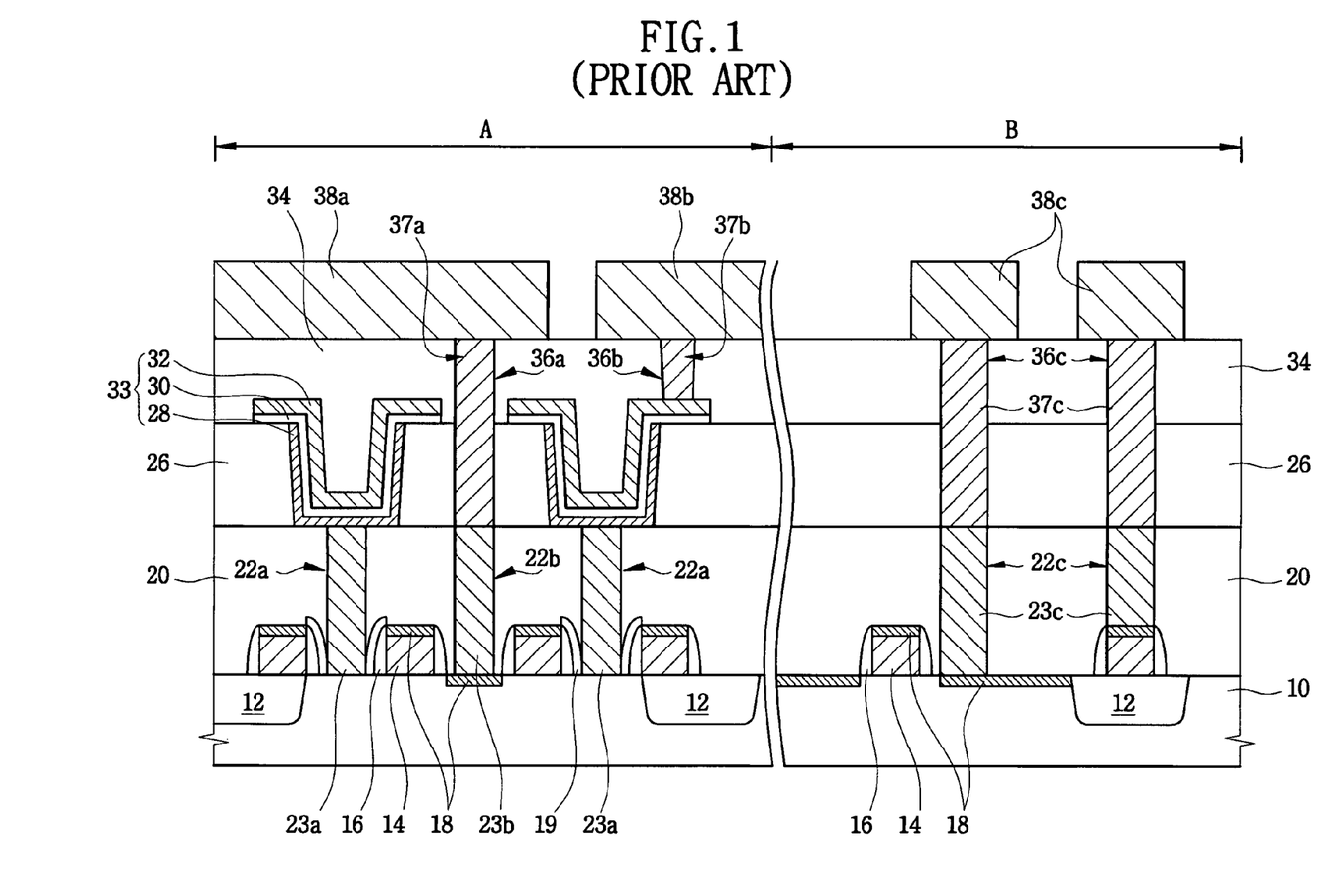
FIG. 1 is a cross sectional view illustrating a conventional EDRAM device having a CUB structure.

FIG. 1 is a cross sectional view illustrating a conventional EDRAM device having a CUB structure. Referring to FIG. 1, a field region 12 is formed using a field isolation process on a substrate 10 that is divided into a cell array region A and a core/peripheral circuit/logic region B.

A gate oxide layer (not shown), a gate electrode 14, a gate spacer 16 and impurity regions (not shown) such as source/drain regions are formed at the surface portions of the substrate 10. The gate electrode 14 typically includes polysilicon and the gate spacer 16 typically includes silicon oxide and/or silicon nitride.

To improve the operational speed of the EDRAM device, a metal silicide layer 18, such as cobalt silicide, nickel silicide or titanium silicide, may be formed on the gate electrode 14 and the substrate 10 through a silicidating reaction. To form the metal silicide layer 18 on desired portions of the gate electrode 14 and the substrate 10, a silicidation blocking layer (SBL) 19 is formed on the gate spacer 16 before the metal silicide layer 18 is formed. The SBL 19 includes a material, such as silicon oxynitride that is generally non-reactive with the metal being used to form the silicide.

A first insulating layer 20 is formed on the resultant structure. The first insulating layer 20 is then patterned and etched to form a storage node contact hole 22a, a bit line contact hole 22b and a dummy metal contact hole 22c. The impurity-doped regions of the cell array region A are exposed through the storage node contact holes 22a and the bit line contact hole 22b. The gate electrode 14 and an impurity-doped region of the core/peripheral circuit/logic region B are exposed through the dummy metal contact holes 22c.

A first metal layer, such as a tungsten layer, is then formed on the first insulating layer 20 to a thickness sufficient to fill the contact holes 22a, 22b and 22c. The uppermost portion of the first metal layer is then removed to expose the surface of the first insulating layer 20, typically through a chemical mechanical polishing (CMP) process or an etch-back process to form contact studs 23a, 23b and 23c that will serve to reduce the depth of a subsequent metal contact and reduce the contact resistance between a lower electrode 28 of a capacitor and the source region of the cell array region A.

A second insulating layer 26, typically including silicon oxide, is then formed on the contact studs 23a, 23b and 23c and the exposed surface of the first insulating layer 20. A capacitor 33 having an MIM structure is formed on the second insulating layer 26. The capacitor 33 includes a lower electrode 28, an upper electrode 32 and a dielectric layer 30. The lower and upper electrodes 28 and 32 may include tungsten nitride or titanium nitride and the dielectric layer 30 may include tantalum oxide ($Ta_2O_5$) or BST-based oxide.

A third insulating layer 34, typically including silicon oxide, is then formed on the second insulating layer 26. The third insulating layer 34 is then patterned and etched using a photolithography process to form metal contact holes 36a, 36b and 36c. The metal contact holes expose the upper surfaces of the contact stud 23b in the bit line contact hole 22b, the contact stud 23c in the dummy metal contact hole 22c and the upper electrode 32.

A second metal layer, such as a tungsten layer, is then formed on the third insulating layer 34 to a thickness sufficient to fill the metal contact holes 36a, 36b and 36c with the second metal layer. The uppermost portion of the second metal layer may then be removed through a CMP or an etch-back process to expose the upper surface of the third insulating layer 34 and thereby form metal plugs 37a, 37b and 37c.

A third metal layer is then formed on the third insulating layer 34 and the metal plugs 37a, 37b and 37c. The third metal layer is patterned and etched through a photolithography process to form a bit line 38a that contacts the metal plugs 37a, 37b and 37c and first metal wirings 38b and 38c.

According to the conventional method for forming an EDRAM having the CUB structure as described above, in order to reduce connection failures between the metal wiring and the impurity regions, the metal contacts are electrically connected to the contact studs 23a, 23b and 23c. Accordingly, the depth of the metal contact hole 36c formed in the core/peripheral circuit/logic region B is substantially identical to a sum of the height of the capacitor 33, the thickness of the upper electrode 32 and the thickness of the third insulating layer 34 between the upper electrode 32 and the first metal wiring 38c. Further, as a result of the separate processes associated with forming the contact studs required in the conventional method, at least three additional lithography processes must be added to the standard logic process to form the EDRAM.

SUMMARY OF THE INVENTION

The exemplary embodiments of the present invention provide semiconductor devices that may be fabricated at a reduced cost and with metal contacts having a reduced depth when compared with semiconductor devices fabricated using a conventional fabrication process. The exemplary embodiments of the present invention also provide a semiconductor fabrication process having a reduced number of lithography processes and forming metal contacts having a reduced depth for producing semiconductor devices having improved reliability at a lower cost when compared with a conventional fabrication process.

A semiconductor device fabricated in accordance with an exemplary embodiment of the present invention includes first and second gate structures formed on first and second regions of a substrate, respectively. An insulating layer is formed on the substrate and the first and second gate structures. A storage node contact hole, a bit line contact hole and a metal contact hole are formed through the insulating layer. A first surface of the substrate adjacent to the first gate structure is exposed through the storage node contact hole and the bit line contact hole. A second surface of the substrate adjacent to the second gate structure is exposed through the metal contact hole. Conductive plugs are formed in the storage node contact hole, the bit line contact hole and the metal contact hole. A first metal wiring is formed on the insulating layer in the second region to make contact with the conductive plug in the metal contact hole. A capacitor is formed on the insulating layer in the first region to make contact with the conductive plug in the storage node contact hole. An insulating interlayer is formed on the capacitor, the first metal wiring and the insulating layer. A second metal wiring formed on the insulating interlayer in the second region.

In a method of fabricating a semiconductor device in accordance with another exemplary embodiment of the present invention, first and second gate structures are formed on first and second regions of a substrate. An insulating layer is formed on the substrate and the first and second gate structures. A storage node contact hole, a bit line contact hole and a metal contact hole are formed through the insulating layer. A first surface of the substrate adjacent to the first gate structure is exposed through the storage node contact hole and the bit line contact hole. A second surface of the substrate adjacent to the second gate structure is exposed through the metal contact hole. The storage node contact hole, the bit line contact hole and the metal contact hole are filled with conductive plugs. A first metal wiring is formed on the insulating layer in the second region to make contact with the conductive plug in the metal contact hole. A capacitor is formed on the insulating layer in the first region to make contact with the conductive plug in the storage node contact hole. An insulating interlayer is formed on the capacitor, the first metal wiring and the insulating layer. A second metal wiring is formed on the insulating interlayer in the second region.

According to the exemplary embodiments of the present invention, separate contact studs are not formed and the first metal wiring has a thickness that is substantially identical to that of the height of the capacitor. As a result, only two additional photolithography processes need be performed in comparison with the standard logic fabrication process, thereby reducing the fabrication cost. Further, because the depth of the metal contact holes is reduced, the process for contact hole formation may be reduced, defects may be reduced and the yield of the fabrication process may be improved.

BRIEF DESCRIPTION OF THE DRAWINGS

The details and advantages of the exemplary embodiments of the invention may be better understood through reference to the following detailed description, particularly when considered in conjunction with the accompanying drawings wherein.

DESCRIPTION OF EXEMPLARY EMBODIMENTS

Figure 2:
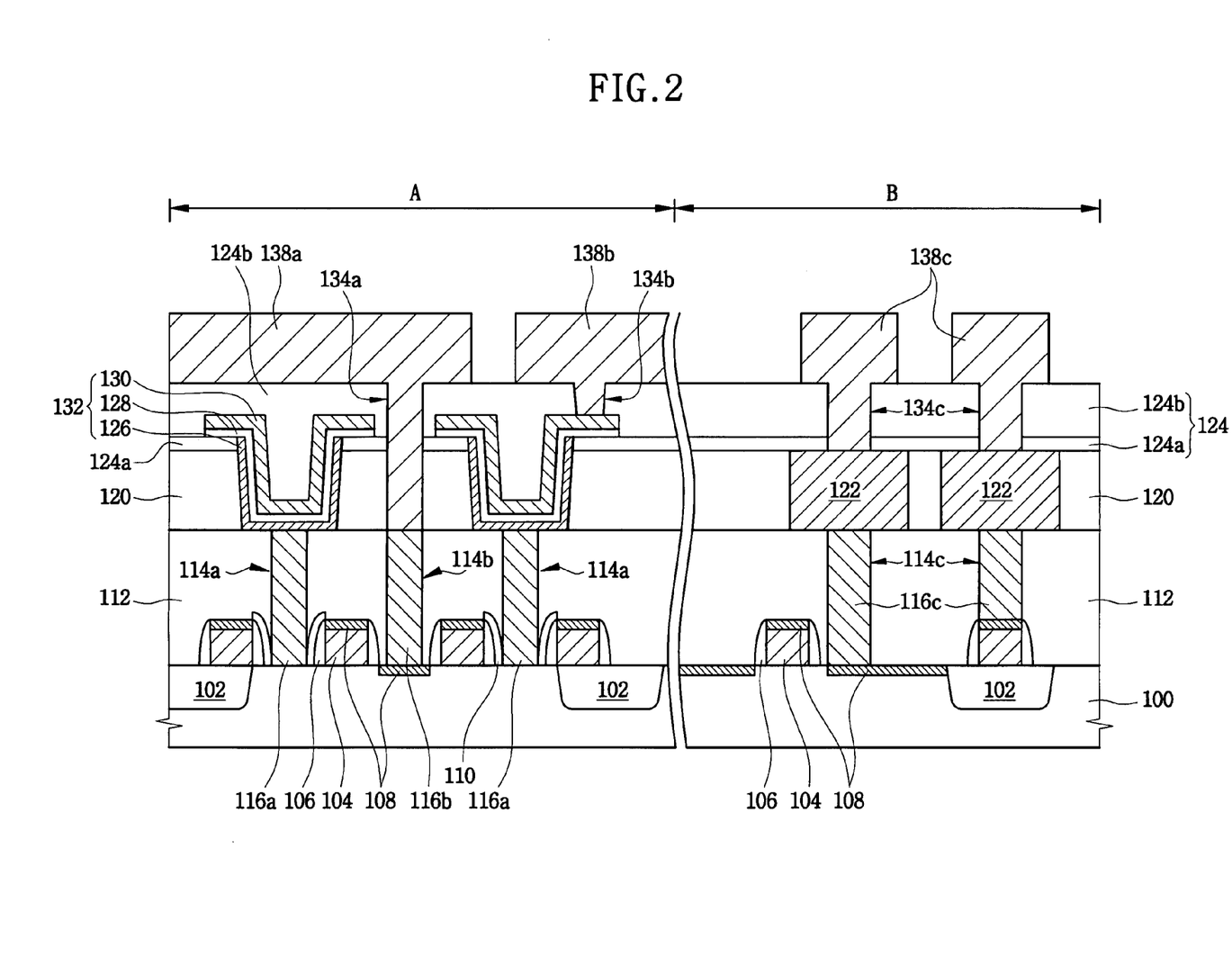
FIG. 2 is a cross sectional view illustrating an EDRAM device having a CUB structure according to an exemplary embodiment of the invention.

FIG. 2 is a cross sectional view illustrating an EDRAM device having a CUB structure according to an exemplary embodiment of the present invention.

Referring to FIG. 2, a substrate 100 is divided into a first region A and a second region B. The first region A corresponds to a cell array region, and the second region B corresponds to a core/peripheral circuit/logic region. Field regions separating and defining the active regions on the substrate 100 may be formed using conventional isolation techniques such as shallow trench isolation (STI).

MOS transistors are then formed on the first and second regions A and B of the substrate 100. The MOS transistors include first and second gate structures, each of which includes a gate electrode 104 and a gate spacer 106 formed on the sidewall of the gate electrode 104, a gate oxide layer (not shown), and an impurity region (not shown). The gate electrode 104 may include polysilicon doped with one or more impurities and the gate spacer 106 may include silicon oxide and/or silicon nitride.

As semiconductor devices have become more highly integrated, the demand for MOS transistors having characteristics of low consumption power, rapid operation and noise tolerance has increased. These desirable transistor characteristics tend to vary as a function of the threshold voltage of the MOS transistor. For example, when the threshold voltage is reduced, the current driving capability tends to increase and provide improved operation speeds. The threshold voltage of the MOS transistor will may vary according to the material of the gate electrode, the material and thickness of the gate insulating layer and width and dopant profile within a channel region in the substrate below the gate insulating layer. Accordingly, to improve the operational speed of MOS transistors, a metal silicide layer 108, such as cobalt silicide, nickel silicide or titanium silicide, may be formed on the gate electrode 104 and the substrate 100 to reduce the effective resistance. A silicidation blocking layer (SBL) pattern 110 of a material such as silicon oxynitride that is generally non-reactive with the metal being used to form the silicide may be formed on one or more of the gate spacers 106.

An insulating layer 112, such as silicon oxide, is then formed on the substrate 100 and the MOS transistors. A first storage node contact hole 114*a* and a first bit line contact hole 114*b* are formed through the insulating layer 112 to expose a first surface of the substrate 100 adjacent to the first gate structure in the first region A. A first metal contact hole 114*c* is formed through the insulating layer 112 to expose the second gate structure and a portion of the substrate 100 in the second region B.

A first metal layer, such as tungsten, is then formed on the insulating layer 112 to a thickness sufficient to fill the contact hole 114*a*, 114*b* and 114*c*, after which the upper portion of the metal layer is removed to leave conductive plugs in each of the contact holes. In particular, the first storage node contact holes 114*a* are filled with storage node plugs 116*a*, the first bit line contact hole 114*b* is filled with a bit line plug 116*b* and the first metal contact holes 114*c* are filled with metal plugs 116*c*. In order to provide an ohmic contact between the conductive plugs 116*a*, 116*b* and 116*c*, the gate structures and the substrate 100, a first metal barrier layer or layers (not shown), such as titanium/titanium nitride, may be formed under the conductive plugs 116*a*, 116*b* and 116*c*.

First metal wiring 122 including a second metal may then be formed on the insulating layer 112 in the second region B to make contact with the metal plug 116*c*. The first metal wiring 122 may include aluminum (Al), an aluminum alloy or copper (Cu).

Capacitors 132 are then formed on the insulating layer 112 in the first region A to make contact with the first storage node plugs 116*a*. The capacitor 132 includes a lower electrode 126, a dielectric layer 128 and an upper electrode 130. The capacitor 132 may have a metal/insulator/metal (MIM) structure and electrodes 126 and 130 may include a conductive metal nitride such as tungsten nitride (WN) or titanium nitride (TiN), or a rare metal such as platinum (Pt), ruthenium (Ru) or iridium (Ir). The dielectric layer 128 may include a dielectric material having a high dielectric constant such as $Ta_2O_5$, $Y_2O_3$, $HfO_2$, $ZrO_2$, $NbO_5$, $BaTiO_3$ or $SrTiO_3$.

An insulating interlayer, typically a silicon oxide, is formed on the capacitor 132, the first metal wiring 122 and the insulating layer 112. When the first metal wiring 122 includes copper, the insulating interlayer will typically include a first layer 120 surrounding the first metal wiring 122 and a second layer 124 formed on the first metal wiring 122 and the first layer 120. The first layer 120 may have an upper surface substantially identical to that of the first metal wiring 122. To increase the capacitance of the capacitor 132, the second layer 124 may include a lower layer 124*a* formed between the upper electrode 130 and the first metal wiring 122 and an upper layer 124*b* formed over the upper electrode.

A second bit line contact hole 134*a* is formed through the insulating interlayers 120 and 124 to expose the bit line plug 116*b*. A second storage node contact hole 134*b* is formed through the insulating interlayer 124 to expose the upper electrode 130. A second metal contact hole 134*c* is formed through the second layer 124 of the insulating interlayer to expose the first metal wiring 122.

A third metal layer, of a material such as aluminum, an aluminum alloy or copper, is formed on the insulating interlayer 124, and then patterned and etched to form a bit line 138*a*, a third metal wiring 138*b* and a second metal wiring 138*c*. The bit line 138*a* extends through the second bit line contact hole 134*a* to make contact with the bit line plug 116*b*, the third metal wiring 138*b* extends through the second storage node contact hole 134*b* to make contact with the upper electrode 130 and the second metal wiring 138*c* extends through the second metal contact hole 134*c* to make contact with the first metal wiring 122.

FIGS. 3A to 3F are cross sectional views illustrating a method for manufacturing an EDRAM device having a CUB structure according to an exemplary embodiment of the invention.

Figure 3A:
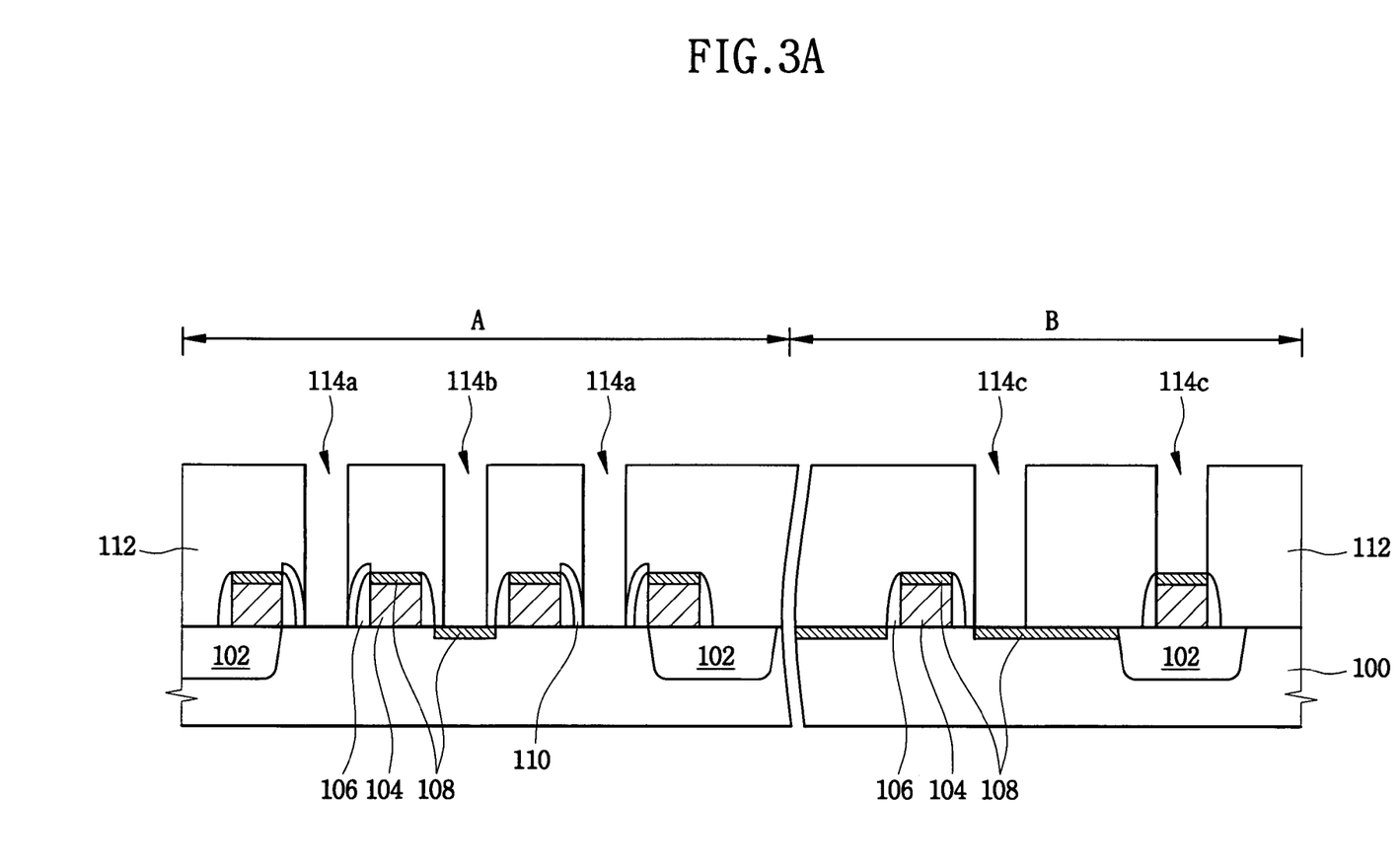
FIGS. 3A to 3F are cross sectional views illustrating an exemplary method for manufacturing an EDRAM device having a CUB structure according to the present invention.

Referring to FIG. 3A, the substrate 100 is divided into the first region A and the second region B with the first region corresponding to a cell array region and the second region corresponding to a core/peripheral circuit/logic region. The field regions 102 used for defining and separating the active regions may be formed on the substrate 100 through a conventional shallow trench isolation (STI) process.

The gate oxide layer (not shown) is formed on the active region of the substrate 100. Polysilicon material is deposited on the gate oxide layer to form the polysilicon layer. Impurities such as phosphorus (P) may be added to the polysilicon layer through a $POCl_3$ diffusing process, an ion implanting process or an in-situ doping process. The polysilicon layer is patterned through a photolithography process to form the gate electrode 104. Insulating materials such as silicon oxide, silicon nitride and/or silicon oxynitride may be deposited to the gate electrode 104 and the substrate 100 through a chemical vapor deposition (CVD) process to form an insulating layer. The insulating layer may then be anisotropically etched to form gate spacers 106 on the sidewalls of the gate electrodes 104. Impurities may be doped into regions of the substrate 100 surrounding the gate spacers 106 to form the source/drain regions of the MOS transistor. Impurities may also be doped into the regions of the substrate 100 adjacent to the gate electrode 104 prior to formation of the gate spacers to create a lightly doped drain (LDD) region. With the formation of the source/drain regions, the MOS transistor is substantially complete.

A material, such as silicon oxynitride, that is generally non-reactive with the metal that will be used for silicidation is deposited on the substrate 100 and the MOS transistor through a low pressure CVD process to form the silicidation blocking layer (SBL). The SBL may then be patterned and etched to form a silicidation blocking layer pattern 110 in predetermined regions of the substrate 100.

A wet cleaning process, or a combination fo wet and dry cleaning processes, may then be performed on the substrate 100 to remove metal contaminants and organic contaminants from the substrate and/or remove a native oxide layer from the silicon and polysilicon surface. A metal layer, such as cobalt, nickel or titanium, may then be deposited on the substrate 100 and subjected to a thermal treatment to form a silicide layer 108 on the unprotected silicon and polysilicon surfaces. The metal silicide layer 108, such as cobalt silicide, nickel silicide or titanium silicide may be formed on the regions of the gate electrodes 104 and the substrate 100 exposed through the silicidation blocking layer pattern 110. To the extent that it is desired that portions of the gate electrode 104 and/or the substrate not include a silicide layer 108, such as electrostatic discharge (ESD) protection structures, such portions may be selectively covered and protected by the SBL pattern 110.

The insulating layer 112 is then formed on the resultant structure, and then patterned and etched through a photolithography process, to form the first storage node contact hole 114a, the first bit line contact hole 114b and the first metal contact hole 114c. The first surface of the substrate 100 in the first region A adjacent to the first gate structure is exposed through the first storage contact hole 114a and the first bit line contact hole 114b. The second surface of the substrate 100 and the second gate structure in the second region B are exposed through the first metal contact hole 114c.

Figure 3B:
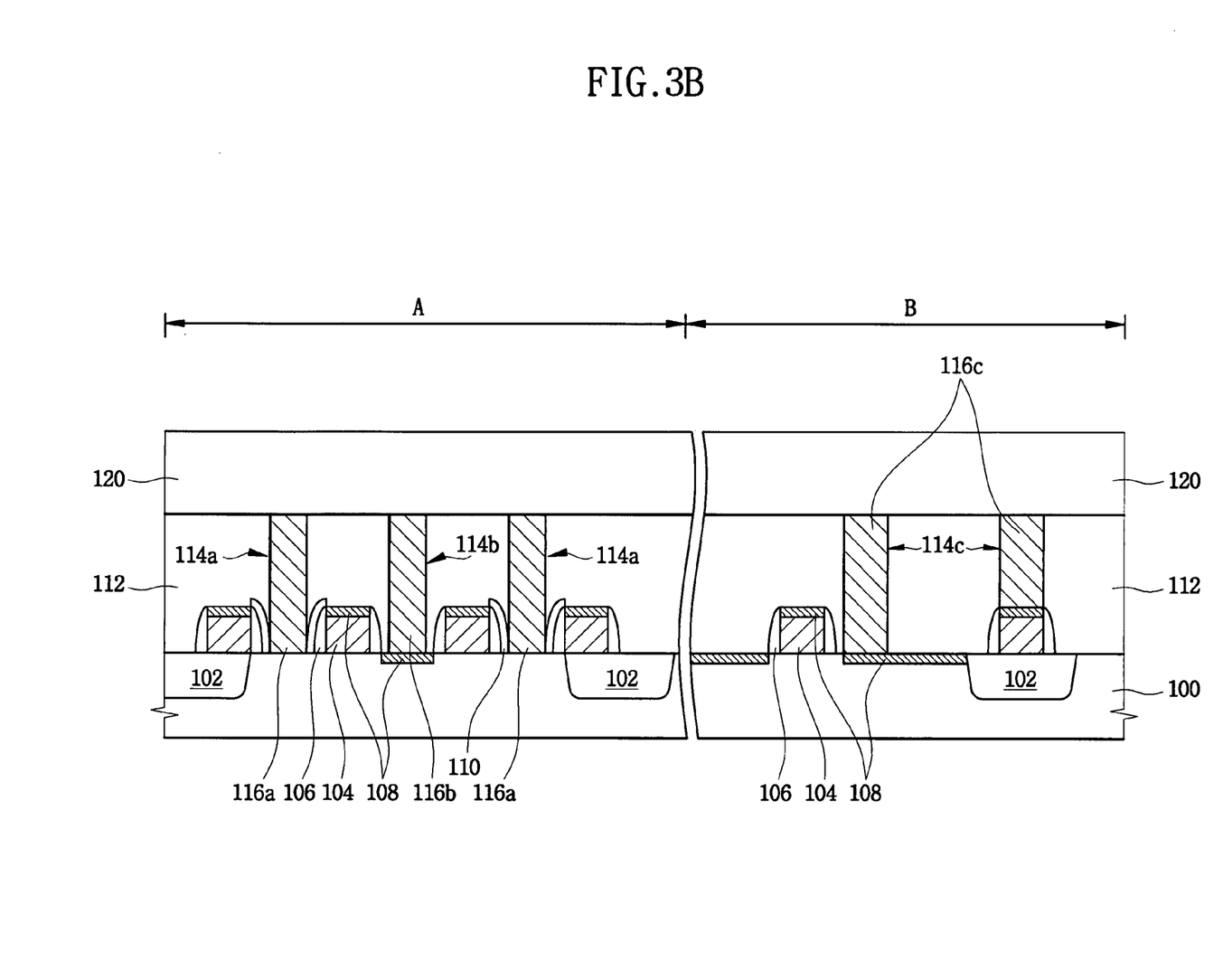

Referring to FIG. 3B, the first metal barrier layer (not shown) including titanium/titanium nitride and the first metal layer including tungsten are formed on the insulating layer 112 and fill the first contact holes 114a, 114b and 114c. The upper portion of the first metal layer is then removed to expose the surface of the insulating layer 112 through a CMP and/or the etch-back process to form conductive plugs in each of the first contact holes 114a, 114b and 114c. The conductive plugs include the storage node plug 116a in the first storage node contact hole 114a, the bit line plug 116b in the first bit line contact hole 114b and the metal plug 116c in the first metal contact hole 114c.

Figure 3C:
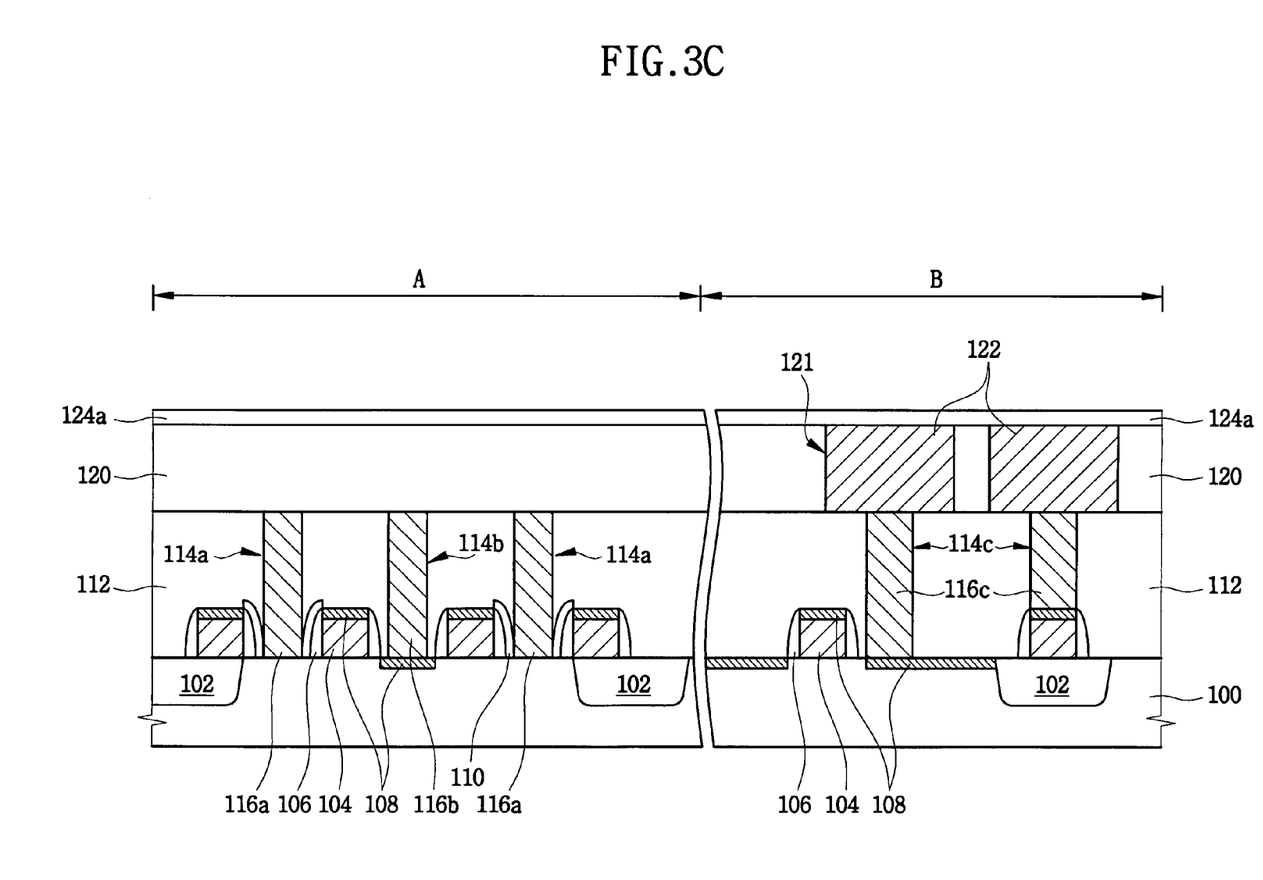

The first layer 120 of the insulating interlayer including oxide is formed on the conductive plugs and the remaining portion of insulating layer 112. With reference to FIG. 3C, the first layer 120 of the insulating interlayer is patterned and etched through a lithography process to form openings 121. The second metal layer is formed on the first layer 120 of the insulating interlayer and in the openings 121. The upper portion of the second metal layer is removed through a CMP and/or etch-back process to expose the surface of the first layer 120 and to form the first metal wiring 122 in the openings 121.

Figure 3D:
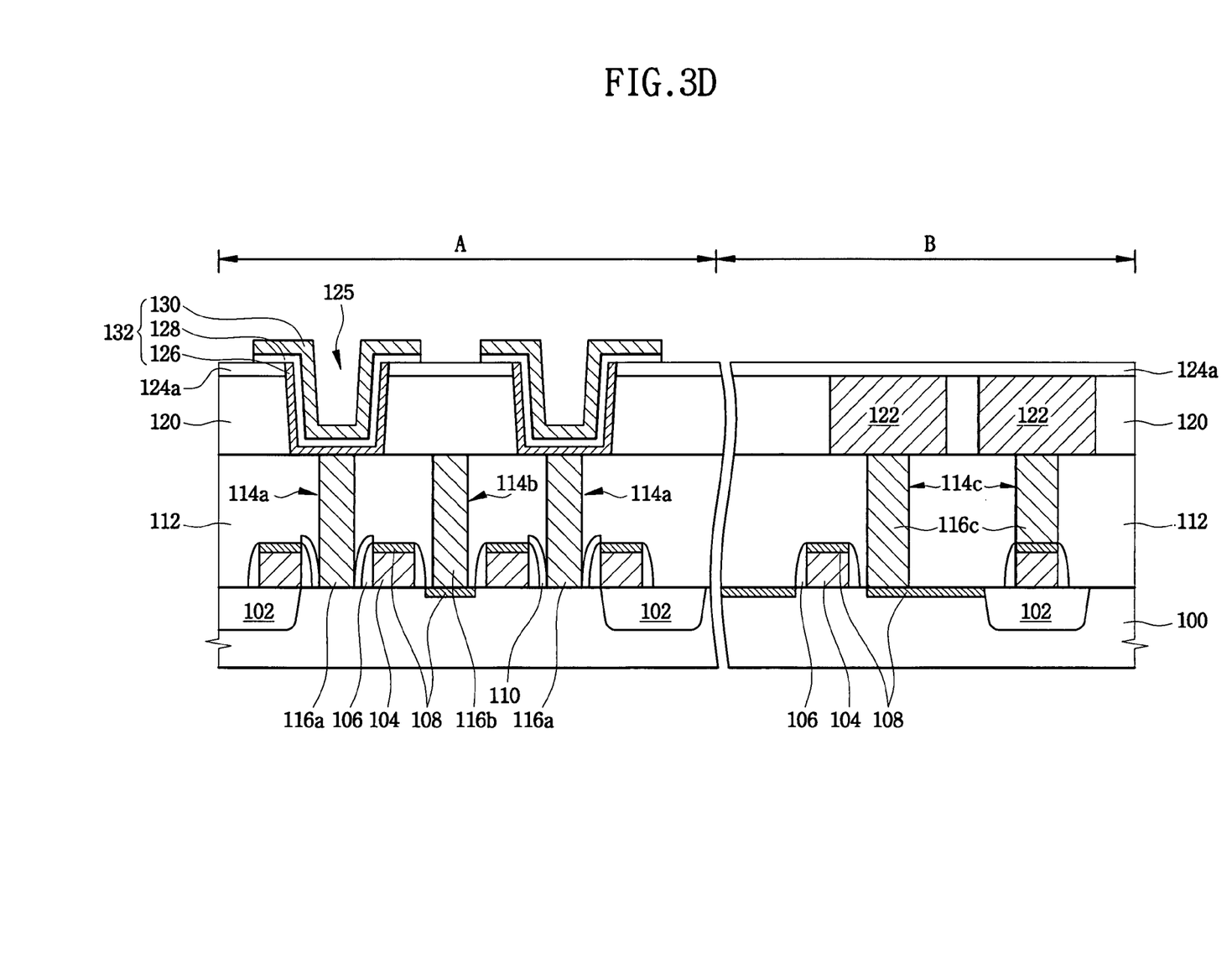

The lower layer 124a of the second layer 124 is formed on the first metal wiring 122 and the first layer 120. With reference to FIG. 3D, the lower layer 124a of the second layer 124 and the first layer 120 are etched to form capacitor openings 125. A conductive material such as tungsten nitride (WN) or titanium nitride (TiN), or a rare metal such as platinum (Pt), ruthenium (Ru) or iridium (Ir) is deposited on the resultant structure including the capacitor opening 125 to form a conductive layer for the lower electrode 126. The upper portion of the conductive layer is then removed through a CMP or etch-back process to expose the surface of the lower layer 124a of the second layer 124 and to form the lower electrode 126 in the capacitor opening 125.

A dielectric layer 128 of a material such as $Ta_2O_5$, $Y_2O_3$, $HfO_2$, $ZrO_2$, $NbO_5$, $BaTiO_3$ or $SrTiO_3$ is formed on the lower electrode 126. The upper electrode 132 is then formed from one or more conductive materials such as tungsten or tungsten nitride on the dielectric layer 128 to complete the capacitor 132. Since the capacitor 132 is formed in the same insulating layer as the first metal wiring 122 in one embodiment, it provides improved control over the thermal budget that can improve the reliability and performance of the MOS transistors and the first metal wiring 122.

The damascene process described above for forming the first metal wiring 122 is particularly useful for metal layers that include copper. For metal layers that do not include copper, such as aluminum and/or aluminum alloys the processing sequence for forming the first metal wiring may be modified. When using a second metal layer including aluminum or aluminum alloy, the metal layer may be formed directly on the insulating layer 112 and the conductive plugs 116a, 116b and 116c. The second metal layer may then be patterned and etched using a conventional photolithography process to form the first metal wiring 122. The first layer 120 of the insulating interlayer may then be formed on the conductive plugs 116a, 116b and 116c and the first metal wiring 122 with the lower layer 124a of the second layer 124 then being formed on the first layer 120 and planarized with CMP process.

Figure 3E:
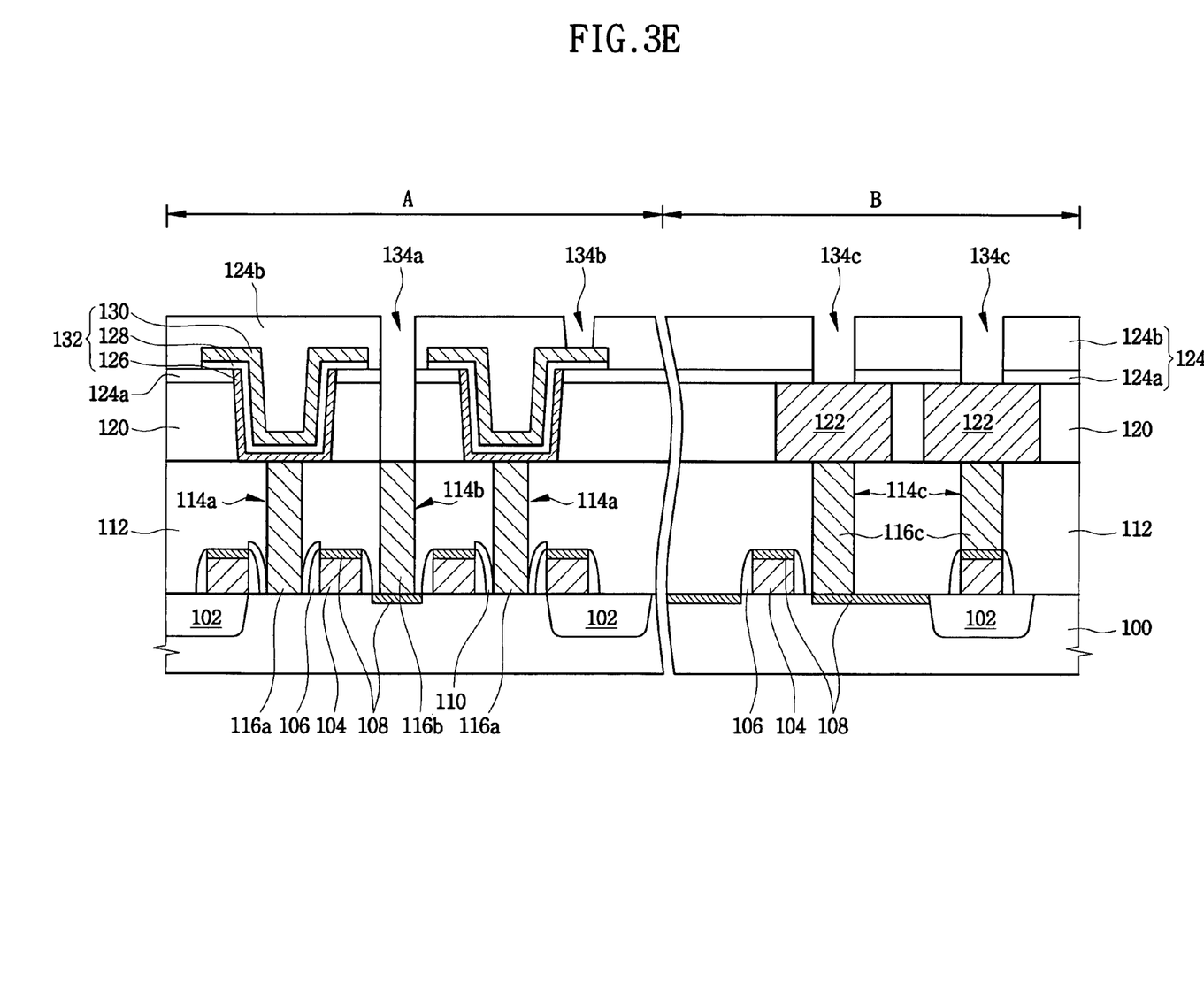

Referring to FIG. 3E, an upper layer 124b of the second layer 124 is then formed on lower layer 124a of the resultant structure to complete the second layer. Accordingly, the insulating interlayer including the first and second layers 120 and 124 is provided between the first and second metal wirings 122 and 138c. The insulating interlayer is then etched to form the second bit line contact hole 134a, the second storage node contact hole 134b and the second metal contact holes 134c. The bit line plug 116b is exposed through the second bit line contact hole 134a, the upper electrode 130 is exposed through the second storage node contact hole 134b and the first metal wiring 122 is exposed through the second metal contact holes 134c.

Figure 3F:
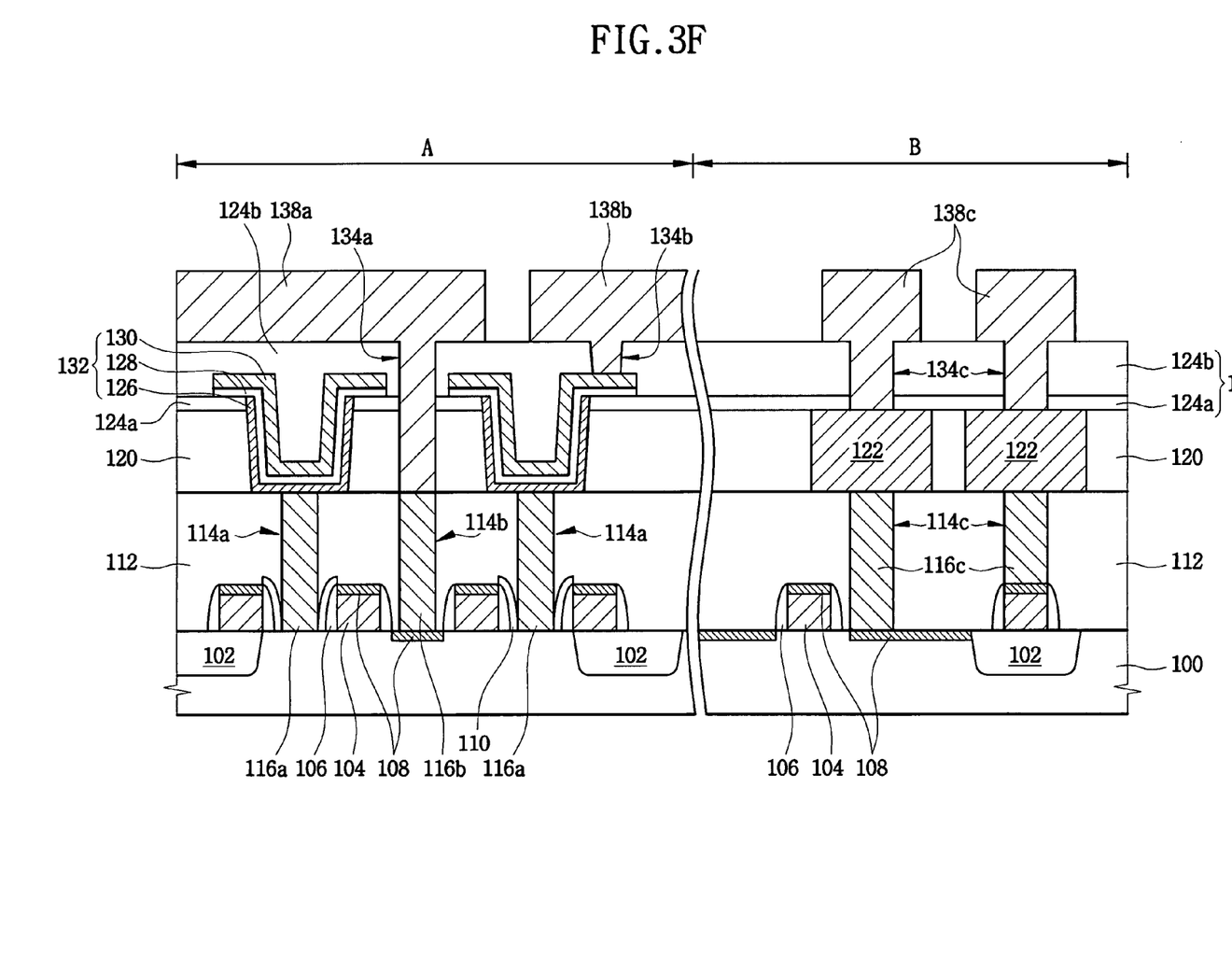

Referring to FIG. 3F, the third metal layer is then formed on the insulating interlayer to a thickness sufficient to fill the second contact holes 134a, 134b and 134c. The third metal layer is then patterned and etched to form the bit line 138a, the third metal wiring 138b and the second metal wiring 138c simultaneously.

When the first metal wiring 122 includes copper, tungsten plugs may be provided in the second contact holes 134a, 134b and 134c to form the second metal wiring 138c through a single-damascene process. Similarly, copper plugs may be formed in the second contact holes 134a, 134b and 134c to form the second metal wiring 138c through a single-damascene process or copper plugs and the second metal wiring 138c may be simultaneously formed through a dual-damascene process. Although the specific composition of the actual structures may vary, the bit line 138a will be electrically connected to the bit line plug 116b, the third metal wiring 138b will be electrically connected to the upper electrode 130 of the capacitor and the second metal wiring 138c will be electrically connected to the first metal wiring 122.

According to one exemplary embodiment of the invention, the first metal contact hole 114c is simultaneously formed with the first storage node contact hole 114a and the first bit line contact hole 114b without forming separate contact studs so that the first metal wiring 122 has a thickness substantially identical to that of the capacitor 132. By not forming separate contact studs, this exemplary process requires only two additional lithography processes in comparison with the standard logic fabrication process, thereby reducing fabrication cost in comparison with conventional fabrication of a CUB structure. Further, the depth of the second metal contact hole 134c will be substantially identical to the height of capacitor 132+ the thickness of the upper electrode 130+ the interval between the upper electrode 130 and the first metal wiring 122− the thickness of the first metal wiring 122. Accordingly, the depths of the first and second metal contact holes 114c and 134c may be reduced, or may allow the yield of semiconductor production and reliability of the resulting devices to be improved.

FIGS. 4A to 4D are cross sectional views illustrating a method for manufacturing an EDRAM device having a CUB structure according to another exemplary embodiment of the invention. In FIGS. 4A to 4D, identical reference numerals are used to identify elements that correspond or are identical to the elements illustrated in FIGS. 3A to 3F and described above.

Figure 4A:
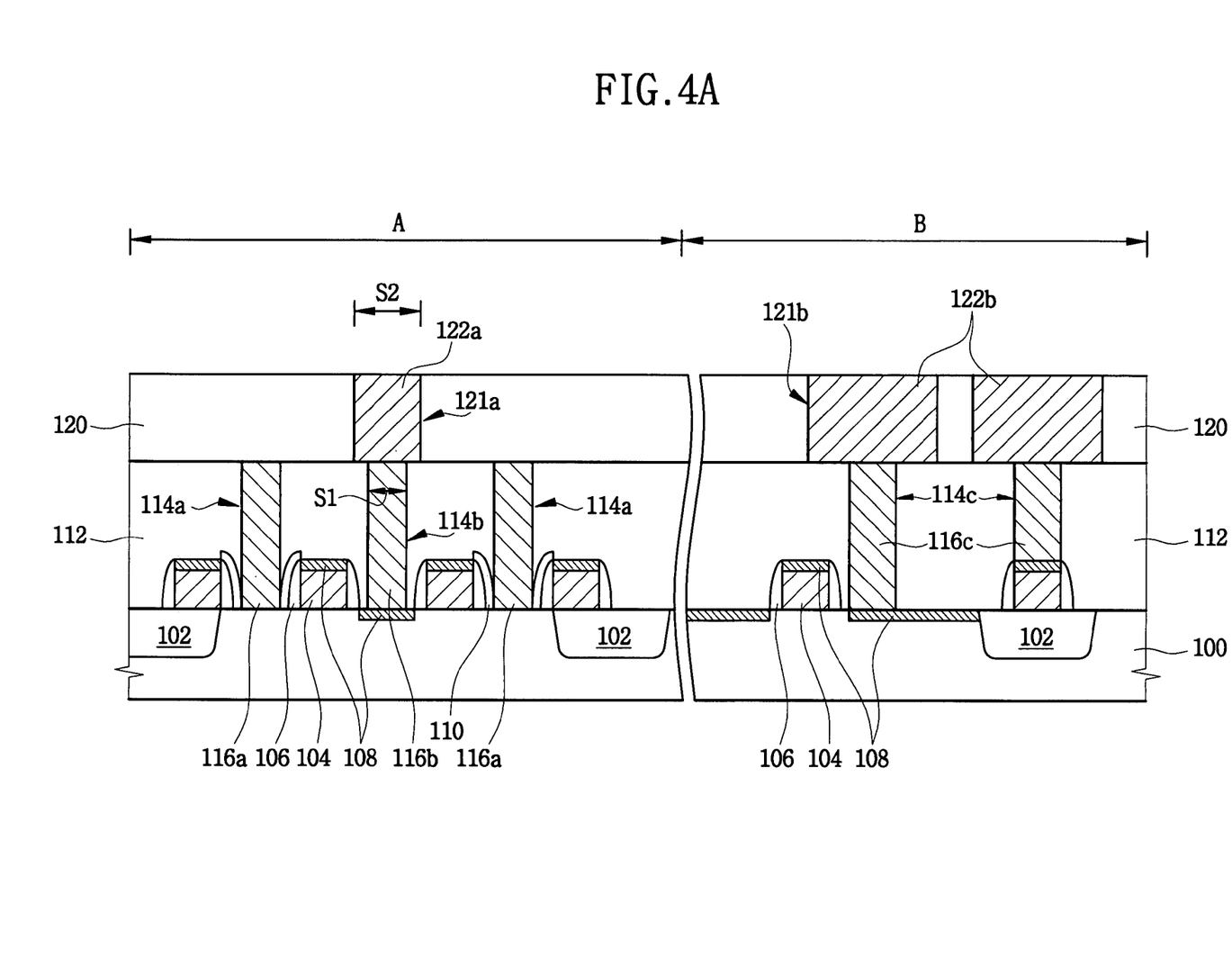
FIGS. 4A to 4D are cross sectional views illustrating another exemplary method for manufacturing an EDRAM device having a CUB structure according to the present invention.

Referring to FIG. 4A, conductive plugs including storage node plugs 116a, a bit line plug 116b and metal plugs 116c are formed in the first storage node contact holes 114a, a first bit line contact hole 114b and the first metal contact holes 114c, respectively, in the same manner as described above with respect to the other exemplary embodiment of the invention.

A first layer 120 of an insulating interlayer is formed on the conductive plugs 116a, 116b and 116c and an insulating layer 112. The first layer 120 of the insulating interlayer is patterned and etched through a photolithography process to form first and second openings 121a and 121b with the bit line plug 116b exposed through the first opening 121a. A first metal wiring is then formed in the second openings 121b.

A second metal layer including copper is formed on the resultant structure to fill the first and second openings 121a and 121b. The upper portion of the second metal layer is then removed through a CMP process to expose the surface of the first layer 120 of the insulating interlayer and to form a landing structure 122a in the first opening 121a and the first metal wiring 122b in the second opening 121b.

The landing structure 122a will be used to reduce the depth of the second bit line contact hole 134a. The landing structure 122a may also vary in size according to the interval margin of the first storage node contact holes 114a. To form a stable resistance, the width S2 of the landing structure 122a is preferably greater than the width S1 of the first bit line contact hole 114b.

Figure 4B:
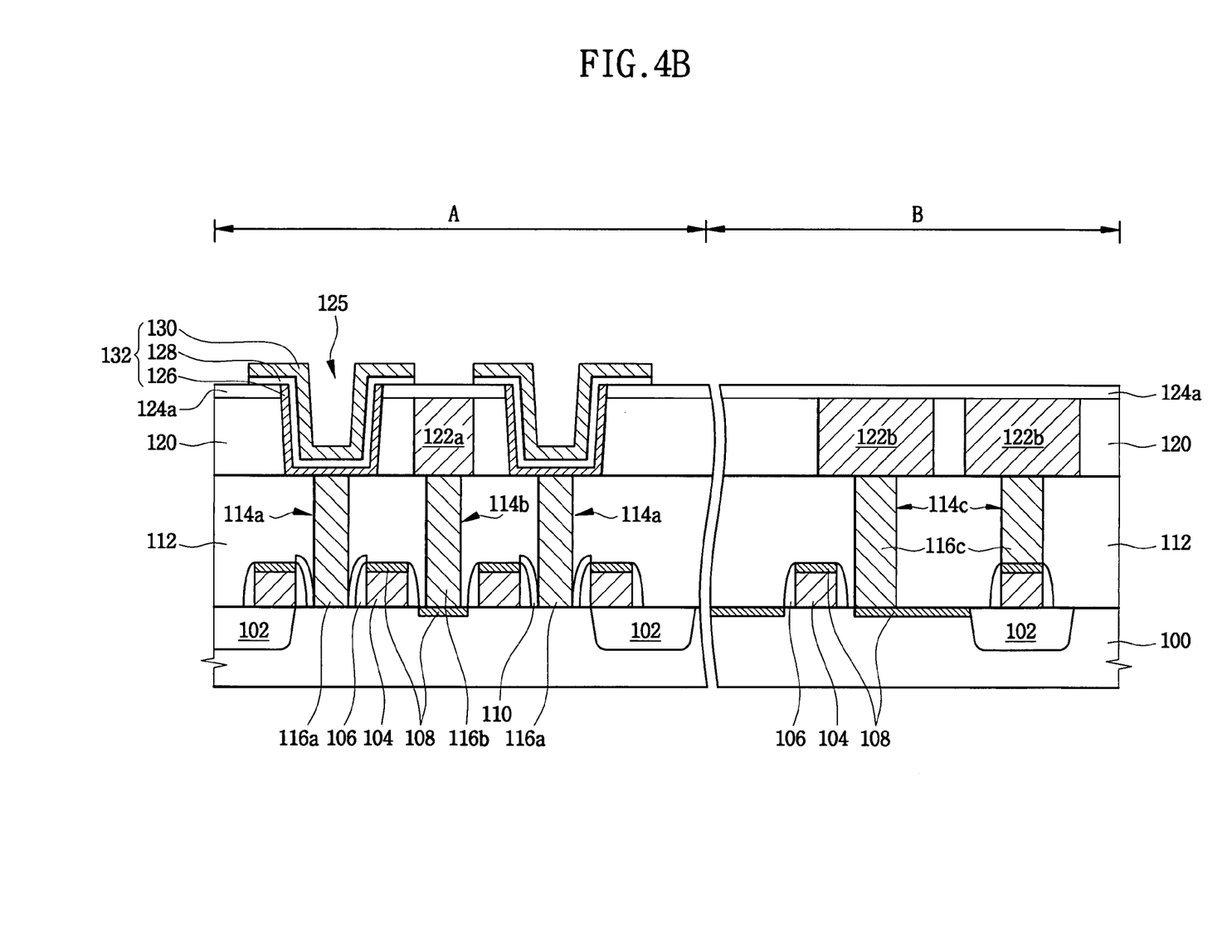

Referring to FIG. 4B, a lower layer 124a of the second layer of the insulating interlayer is formed on the resultant structure. The lower layer 124a increases height of a capacitor, thereby increasing its capacitance. The lower layer 124a of the second layer 124 and the first layer 120 of the insulating interlayer are then patterned and etched through a photolithography process to form a capacitor opening 125. The capacitor 132, including a lower electrode 126, dielectrics layer 128 and an upper electrode 130, may then be formed in the same manner as detailed above with respect to the other exemplary embodiment of the invention. Again, the processing steps involved in forming the capacitor may be controlled to reduce the thermal budget and thereby improve the electrical characteristics and reliability of the MOS transistor and the first metal wiring 122b.

When the conductive materials used to form the first metal wiring 122b and the landing structure 122a include copper, the damascene process described above is preferred. However, when the first metal wiring 122b and the landing structure 122a are formed from materials that do not include copper but instead consist primarily of aluminum and/or aluminum alloys, a modified process may be used. In the modified process, a second metal layer including aluminum or aluminum alloy is formed on the resultant structure including insulating layer 112 and the conductive plugs 116a, 116b and 116c. The second metal layer is then patterned and etched using a conventional photolithography process to form the landing structure 122a and the first metal wiring 122b. The first layer 120 of the insulating interlayer is formed on the conductive plugs 116a, 116b and 116c, the insulating layer 112, the landing structure 122a and the first metal wiring 122b. The lower layer 124a of the second layer 124 of the insulating interlayer is formed on the first layer 120 and planarized using a CMP process after which the capacitor 132 may be formed as detailed above.

Figure 4C:
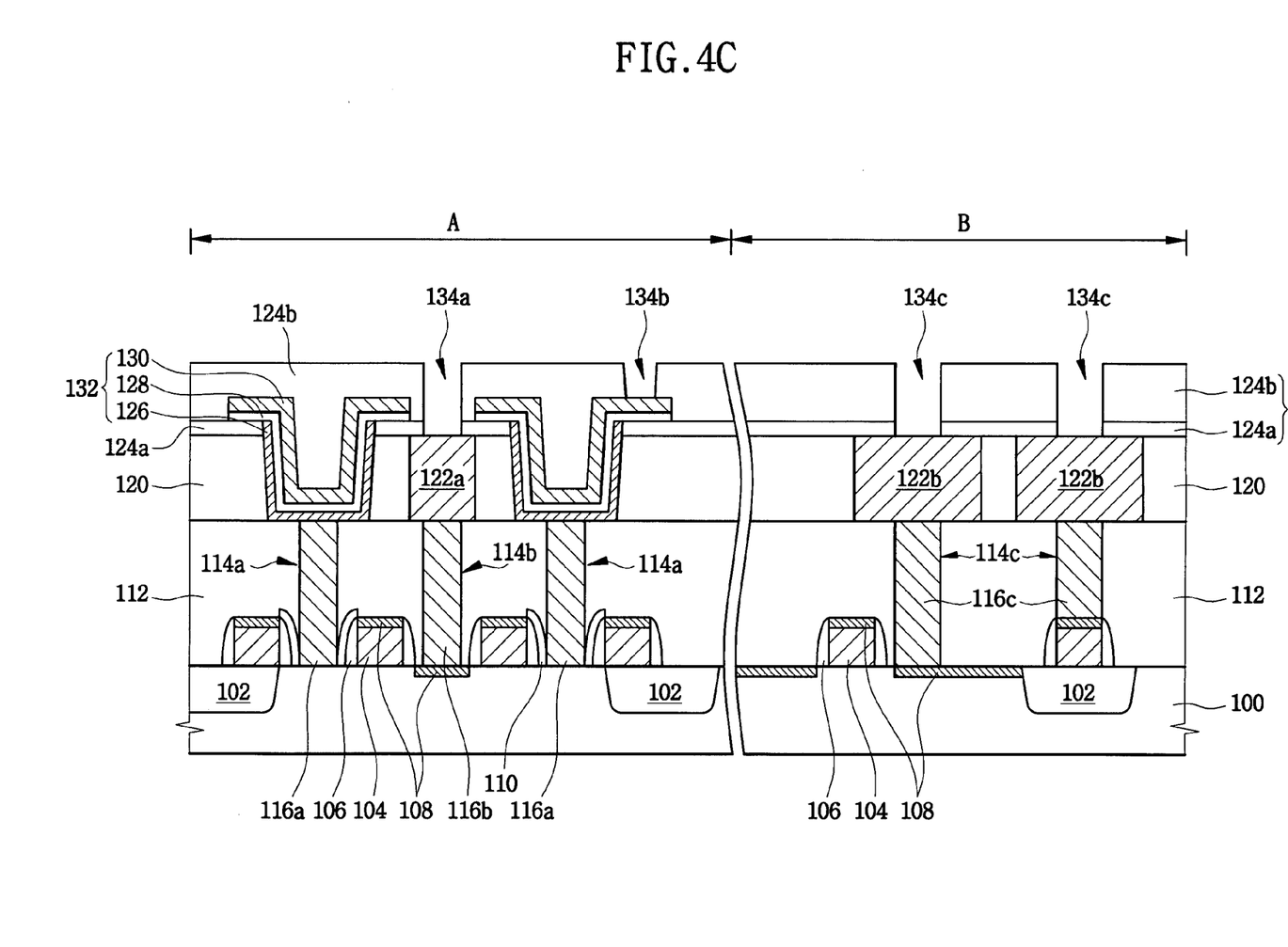

Referring to FIG. 4C, an upper layer 124b of the second layer 124 of the insulating interlayer is formed on the resultant structure having the capacitor 132. Accordingly, the insulating interlayer including the first layer 120 and the second layer 124 is interposed between the first metal wiring 122 and a second metal wiring. The insulating interlayer 120 and 124 are then patterned and etched through a photolithography process to form a second bit line contact hole 134a, a second storage node contact hole 134b and a second metal contact hole 134c. The landing structure 122a is exposed through the second bit line contact hole 134a, the upper electrode 130 is exposed through the second storage node contact hole 134b and the first metal wiring 122b is exposed through the second metal contact hole 134c.

Figure 4D:
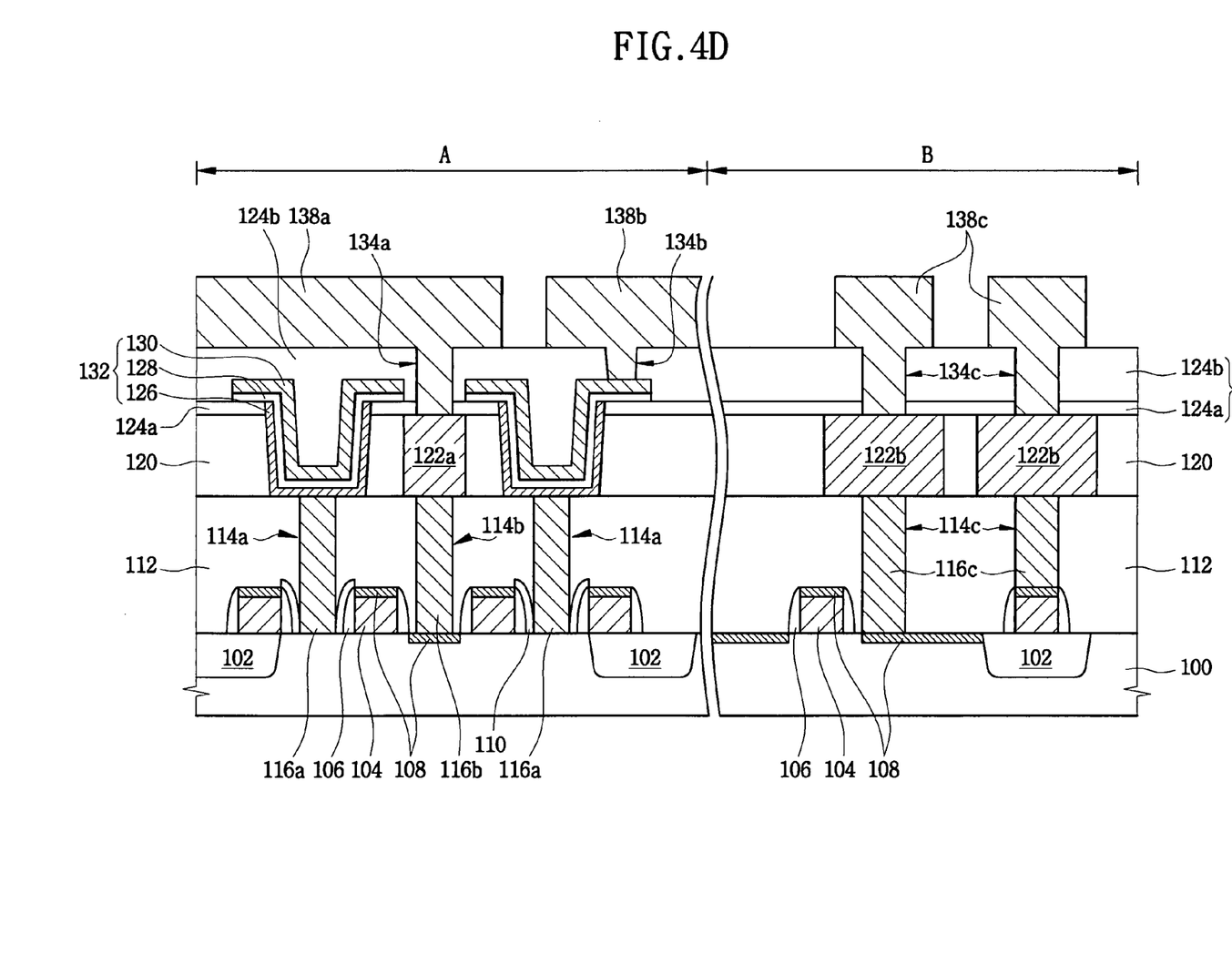

Referring to FIG. 4D, a third metal layer including aluminum or aluminum alloy is formed on the insulating interlayer and fills the second contact holes 134a, 134b and 134c. The third metal layer is then patterned and etched to form a bit line 138a, a third metal wiring 138b and a second metal wiring 138c simultaneously.

When the first metal wiring 122b includes copper, tungsten plugs may be formed in the second contact holes 134a, 134b and 134c to form the second metal wiring 138c through a single-damascene process. Copper plugs may be formed in the second contact holes 134a, 134b and 134c to form the second metal wiring 138c through the single-damascene process. Copper plugs and the second metal wiring 138c may also be formed simultaneously through a dual-damascene process. Although the specific composition of the actual structures may vary, the bit line 138a will be electrically connected to the landing structure 122a, the third metal wiring 138b will be electrically connected to the upper electrode 130 of the capacitor and the second metal wiring 138c will be electrically connected to the first metal wiring 122b.

According to another exemplary embodiment of the invention, the landing structure 122a may be simultaneously formed with the first metal wiring 122b so that the depth of the second bitline contact hole 134a will be substantially identical to that of the second metal contact hole 134c. Accordingly, the width of the second bit line contact hole 134a may be reduced, thereby increasing the interval margin between the upper electrode 130 and the bit line 138a.

As described above, by omitting the formation of separate contact studs, the exemplary embodiments of the methods according to the present invention produce a first metal wiring that has a thickness that is substantially identical to the height of the capacitor. Therefore, only two additional lithography processes are performed in comparison with the standard logic process, thereby reducing when compared with the conventional fabrication of CUB structure. Further, the depth of the metal contact hole may be reduced, which may result in improved yield and/or improved reliability of the completed devices.

Having described the preferred embodiments for forming the dielectric layers, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A semiconductor device, comprising:
   a cell array region formed in a semiconductor substrate and including a capacitor having a lower electrode and an upper electrode, the lower electrode having a lower electrode height;
   a peripheral circuit region formed in the semiconductor substrate and including a first metal wiring, the first metal wiring having a first metal height and having a lower surface in a substantially planar orientation with a lower surface of the lower electrode;
   a first insulating layer formed on the cell array region and the peripheral circuit region and having openings; and
   a second insulating layer formed on the first insulating layer, the first metal wiring being arranged entirely in the second insulating layer,
   wherein the second insulating layer includes a first sub-layer surrounding the first metal wiring and a second sub-layer formed on the capacitor, the first metal wiring and the first sub-layer, the second sub-layer including a lower layer that is formed substantially along the entire substrate and between the upper electrode and the first metal wiring, and an entire upper layer that is formed substantially along the entire substrate and over the upper electrode, and the first sub-layer is distinct from the second sub-layer, and
   wherein the capacitor extends at least an entire vertical length of the first sub-layer.

2. The semiconductor device of claim 1, further comprising:
   a first conductive plug extending through the first insulating layer to connect the lower electrode to the semiconductor substrate; and
   a second conductive plug extending through the first insulating layer to connect the first metal wiring to the semiconductor substrate.

3. The semiconductor device of claim 2, further comprising a conductive landing structure arranged in the second insulating layer and having a pad thickness, wherein the pad thickness is substantially identical to the first metal thickness, and wherein a lower surface of the landing structure and the lower surface of the first metal wiring are in a planar orientation.

4. The semiconductor device of claim 3, further comprising a third conductive plug extending through the first insulating layer to connect the landing structure to the semiconductor substrate.

5. The semiconductor device of claim 1, further comprising:
   first gate structures formed in the cell array region, the first insulating layer being formed on the first gate structures;
   second gate structures formed in the peripheral region, the first insulating layer being formed on the second gate structures;
   a first storage node contact hole and a first bit line contact hole formed through the first insulating layer for exposing a first surface of the substrate in the cell array region;
   first metal contact holes formed through the first insulating layer for exposing the first and second gate structures and a second surface of the substrate in the peripheral region;
   conductive plugs formed in the first storage node contact hole, the first bit line contact hole and the first metal contact hole, the first metal wiring being in electrical contact with the conductive plug in the first metal contact hole;
   a capacitor formed in the second insulating layer in the cell array region, the capacitor being in electrical contact with the conductive plug in the first storage node contact hole; and
   a second metal wiring formed on the second insulating layer in the peripheral region, the second metal wiring being electrically connected to the first metal wiring.

6. The semiconductor device of claim 5, wherein the peripheral region includes at least one of core circuitry, peripheral circuitry and logic circuitry.

7. The semiconductor device of claim 5, wherein the capacitor has a metal/insulator/metal structure.

8. The semiconductor device of claim 5, further comprising a bit line formed on the second insulating layer and electrically connected to the conductive plug in the first bit line contact hole through a second bit line contact hole formed through the second insulating layer, wherein the bit line and the second metal wiring are formed from a single metal layer.

9. The semiconductor device of claim 4, wherein the landing structure has a pad width $W_{LP}$ and the third conductive plug has a plug width $W_{CP}$, wherein the relationship $W_{LP} > W_{CP}$ is satisfied.

10. The semiconductor device of claim 1, wherein the lower electrode of the capacitor extends into the lower layer of the second sub layer, and the upper electrode of the capacitor extends above and is formed partially on the upper layer of the second sub-layer.

* * * * *